US008254121B2

(12) United States Patent
Lee et al.

(10) Patent No.: US 8,254,121 B2
(45) Date of Patent: Aug. 28, 2012

(54) COOLER AND DISPLAY DEVICE HAVING THE SAME

(75) Inventors: Moon-chul Lee, Seongnam-si (KR); Min-soo Kim, Seoul (KR); Yong-soo Lee, Seoul (KR); Sru Kim, Anyang-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 181 days.

(21) Appl. No.: 12/868,061

(22) Filed: Aug. 25, 2010

(65) Prior Publication Data
US 2011/0167845 A1    Jul. 14, 2011

(30) Foreign Application Priority Data

Jan. 12, 2010    (KR) .................. 10-2010-0002752

(51) Int. Cl.
*H05K 7/20* (2006.01)
*F01D 9/00* (2006.01)
(52) U.S. Cl. .. 361/695; 361/694; 165/80.2; 165/104.33; 415/203; 415/204; 415/205; 454/184
(58) Field of Classification Search .................. None
See application file for complete search history.

(56) References Cited

U.S. PATENT DOCUMENTS 4,851,965 A *  7/1989  Gabuzda et al. ............. 361/691
4,907,645 A *  3/1990  Dumas et al. ................. 165/41
6,493,440 B2 * 12/2002  Gromatzky et al. .......... 379/161
6,652,373 B2 * 11/2003  Sharp et al. .................. 454/184
6,874,331 B2 *  4/2005  Chandler et al. ............. 62/256
7,463,487 B2 * 12/2008  Kim ............................. 361/715
7,630,198 B2 * 12/2009  Doll ........................ 361/679.49
8,120,912 B2 *  2/2012  Aybay et al. ................. 361/695
2005/0168943 A1   8/2005  Bang et al.
2006/0082271 A1*  4/2006  Lee et al. ....................... 313/35
2006/0146494 A1   7/2006  Chiu et al.
2006/0292975 A1  12/2006  Lin et al.

OTHER PUBLICATIONS

EP Search Report issued Sep. 16, 2011 in EP Application No. 10177476.8.

* cited by examiner

*Primary Examiner* — Boris Chervinsky
(74) *Attorney, Agent, or Firm* — Stanzione & Kim, LLP

(57) ABSTRACT

A cooler and a display device including the cooler. The cooler includes: a housing; an air blowing unit disposed inside the housing and sucking external air and blowing the external air in the housing, wherein the air blowing unit includes a plurality of groups each including two air blowers; a guide vane disposed above the air blowing unit and to guide air flowed out from the air blowing unit to flow in different directions; and a plurality of auxiliary guide vanes disposed between the air blowing unit and the guide vane, and each disposed in each of the groups each including two air blowers, so as to guide air flowing below the air blowing unit to flow toward the guide vane.

30 Claims, 7 Drawing Sheets

COOLER AND DISPLAY DEVICE HAVING THE SAME

CROSS-REFERENCE TO RELATED APPLICATIONS

This application claims priority under 35 U.S.C. §119(a) from Korean Patent Application No. 10-2010-0002752, filed on Jan. 12, 2010, in the Korean Intellectual Property Office, the disclosure of which is incorporated herein in its entirety by reference.

BACKGROUND

1. Field of the Invention

The present general inventive concept relates to a cooler and a display device including the same, and more particularly, to a cooler that can uniformly cool the entire surfaces of a large display device and a display device including the cooler.

2. Description of the Related Art

Digital display devices employing a liquid crystal display (LCD) or a plasma display panel (PDP) consume a large amount of power and generate a large amount of heat. When a digital display device is installed in an indoor or outdoor place, a temperature of a display panel increases due to heat of sunlight, and accordingly, a cooler to decrease the temperature of the display panel is required.

In general, a conventional cooler mainly uses a blower to cool a display panel by blowing air by revolving a fan. In the conventional cooler, a large-sized fan is used to increase a cooling performance, and thus the size of a housing covering the fan is increased, thereby increasing the entire size of the blower.

To solve this problem, there is a need to develop a device to reduce the size of a blower and to improve a cooling efficiency of the blower, by arranging a plurality of small-sized blowers and simultaneously operating the blowers. However, such a device results in non-uniformity of air flow rate during cooling and also results in loss of air flow rate. In particularly, when a temperature distribution of a display panel is not uniform due to the non-uniformity of air flow rate, the display panel eventually deteriorates, thereby resulting in deterioration in performance of the display panel.

Accordingly, there is a need to develop a device capable of preventing the display panel from deteriorating by removing the non-uniformity and loss of air flow rate in the cooler including a plurality of blowers.

SUMMARY

The present general inventive concept provides a cooler capable of removing non-uniformity and loss of air flow rate, and a display device including the cooler.

Additional features and utilities of the present general inventive concept will be set forth in part in the description which follows and, in part, will be obvious from the description, or may be learned by practice of the present general inventive concept.

According to a feature of the present general inventive concept, there is provided a cooler comprising a housing, an air blowing unit disposed inside the housing and sucking external air and blowing the external air in the housing, wherein the air blowing unit comprises a plurality of groups each including two air blowers, a guide vane disposed above the air blowing unit and guiding air that flows out from the air blowing unit to flow in different directions, and a plurality of auxiliary guide vanes disposed between the air blowing unit and the guide vane, each of the auxiliary guide vane being disposed in each of the groups each including two air blowers, so as to guide air flowing below the air blowing unit to flow toward the guide vane.

In another feature of the present general inventive concept, a display device is provided comprising a display unit to display an image, and a cooler to cool heat generated from the display unit. The cooler comprise a housing, an air blowing unit disposed inside the housing and sucking external air and blowing the external air in the housing, wherein the air blowing unit comprises a plurality of groups each including two air blowers, a guide vane disposed above the air blowing unit and guiding air that flows out from the air blowing unit to flow in different directions, and a plurality of auxiliary guide vanes disposed between the air blowing unit and the guide vane, each of the auxiliary guide vanes being disposed in each of the groups each including two air blowers, so as to guide air flowing below the air blowing unit to flow toward the guide vane.

In yet another feature of the present general inventive concept, there is provided a cooler comprising a housing extending lengthwise along an axis and having an air chamber traversing along the axis and extending to a top opening, an air blowing unit disposed in the housing and below the air chamber and including a plurality of air blowers disposed along the axis of the housing to draw external air inside the housing and to flow air upward toward the air chamber, and a guide vane disposed in the chamber and defining a front cooler air channel extending to the top opening of the housing and a rear cooler air channel extending to the top opening of the housing.

In still another feature of the present general inventive concept, a display device is provided comprising a display housing including a top and a bottom having an air passage and a front portion extending from the bottom to the top and a rear portion extending from the bottom to the top and having a front housing air path inside the front portion extending from the air passage to the top of the housing and a rear housing air path inside the rear portion extending from the air passage to the top of the housing, and display unit disposed in the housing and between the front housing air path and the rear housing air path. The display device includes a cooler comprises a cooler housing including an open top disposed against the air passage of the bottom of the display housing and including an air chamber inside the cooler housing extending to the open top to direct air toward the air passage of the display housing. The cooler includes an air blowing unit disposed in the cooler housing and below the air chamber, at least one blower to draw external air inside the cooler housing and to flow the drawn air upward toward the air chamber, and a guide vane disposed in the chamber and defining a front cooler air channel in communication with the front housing air path and defining a rear cooler air channel in communication with the rear housing air path, wherein air drawn into the cooler housing by the blower flows from the front and rear cooler air channels into the front and rear housing paths, respectively, via the guide vane and the display unit is cooled as air flows through the front housing air path and the rear housing air path.

According to another feature of the present general inventive concept, there is provided a method of cooling a display unit included in a display device using a cooling unit, comprising drawing external air into the cooling unit, capturing the drawn air into an air chamber of the cooling unit, dividing the captured air in the air chamber into a front air flow and a rear air flow, flowing the front air flow across a front side of the display unit, and flowing the rear air flow across a rear side of the display unit.

BRIEF DESCRIPTION OF THE DRAWINGS

The above and/or other features of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
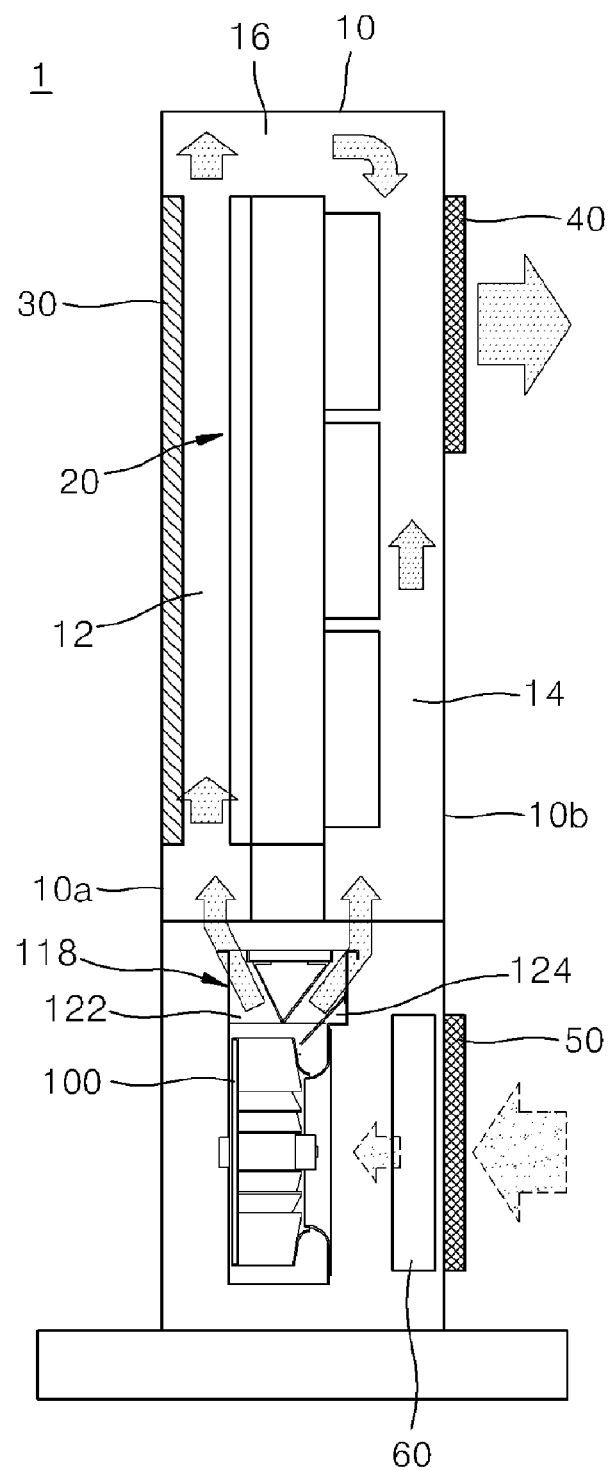
FIG. 1 is a cross-sectional view of a display device including a cooler, according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Referring to FIG. 1, a display device 1 includes a display device housing 10 and a display unit 20 surrounded by the display device housing 10 to display an image. The display device housing may include a front housing air path 12 and a rear housing air path 14. The front housing air path 12 may receive a front air flow, and direct the front air flow across a front portion of the display unit 20, while the rear housing air path may receive a rear air flow, and direct the rear flow across a rear portion of the display unit. Additionally, a top portion of the display housing 10 may including a top air flow path 16 that communicates the front housing air path 12 with the rear housing air path 14 such that front air flow may travel from front housing air path to the rear housing air path. The front and rear air flows are discussed in greater detail below.

A cooler 100 may be disposed below the display unit 20 to cool heat generated from the display unit 20. A protecting glass 30 may be formed on a front surface 10a of the display device housing 10 to protect the display unit 20. The display device 1 may include an air outlet 40 that may be formed on a rear surface 10b of the display device housing 10 to discharge air to the outside, and an air inlet 50 may be formed on the rear surface 10b through which air may pass to enter the cooler 100. Additionally, a filter 60 may be formed between the air inlet 50 and the cooler 100 to filter dust from air that enters through the air inlet 50.

Referring to FIGS. 2-5, the cooler 100 draws external air into the display device housing and blows the external air to the display unit 20 to cool heat generated from the display unit 20. The cooler 100 includes a cooler housing 101, an air blowing unit 110 that is surrounded by the cooler housing 101 to blow air, an air chamber 118, a guide vane 120, an auxiliary guide vane 130, an interference preventing portion 141, auxiliary interference preventing portions 142 and 143, a vortex removing portion 150, a side auxiliary guide vane 160, and a suction inducing unit 170. The cooler housing 101 further includes a front plate 102, a back plate 103, side plates 104 and 105, and a rear plate 106.

The air blowing unit 110 draws external air into the cooler housing 101 through the air inlet 50 and blows the air to the display unit 20 formed above the air blowing unit 110. The air chamber 118 may be disposed above the air blowing unit 110 to capture the drawn air that is directed upward.

The air blowing unit 110 may include a plurality of air blowers, which may be disposed in various arrangements. For example, four air blowers 111, 112, 113, and 114 may be arranged in a row in a lengthwise direction (y direction) of the cooler 100. Further, the four air blowers may be grouped into pairs of two. Each pair of air blowers may be grouped along the lengthwise direction (y direction) of the cooler 100. In other words, two air blowers 111 and 112 may be grouped into a first group, and the two air blowers 113 and 114 may be grouped into a second group. Accordingly, as illustrated in FIGS. 2 through 5, the air blowing unit 110 according to an embodiment of the present general inventive concept may include at least two groups. The number of air blowers of the air blowing unit 110 is not limited thereto. Further, an even number of air blowers may be disposed in various arrangements.

Figure 2:
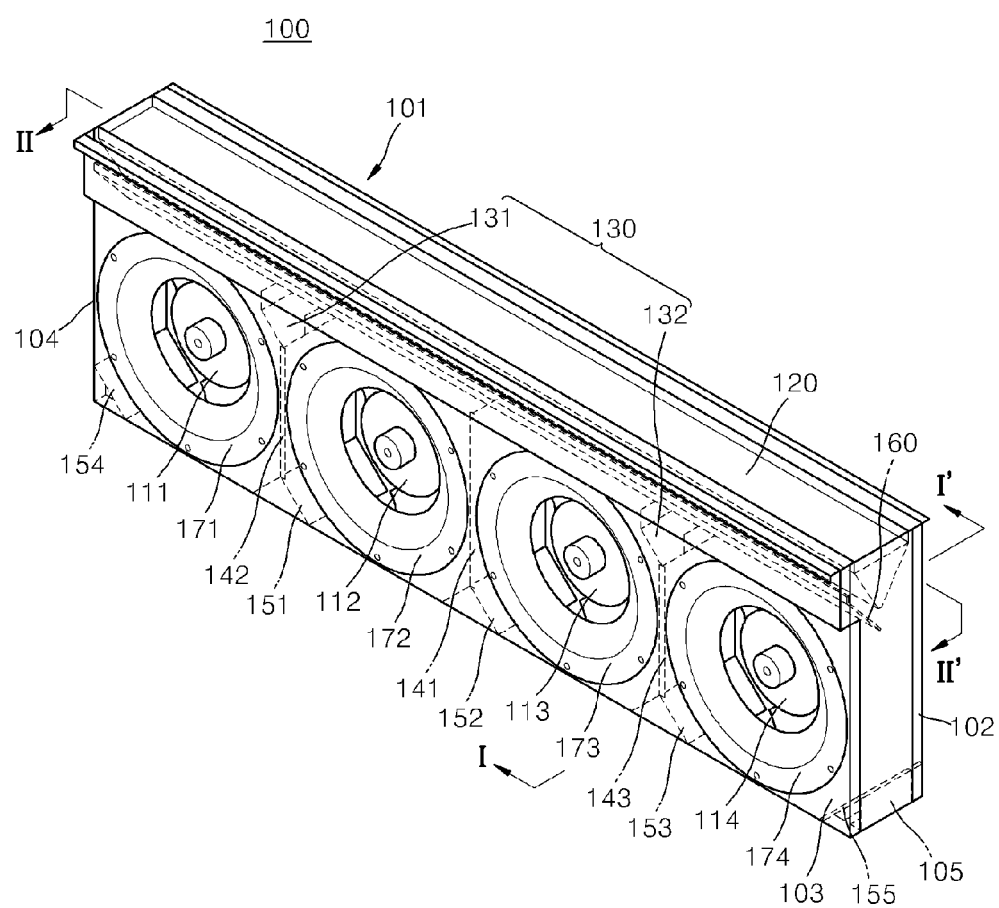
FIG. 2 is a perspective view of a cooler, according to an exemplary embodiment of the present general inventive concept.
Figure 4:
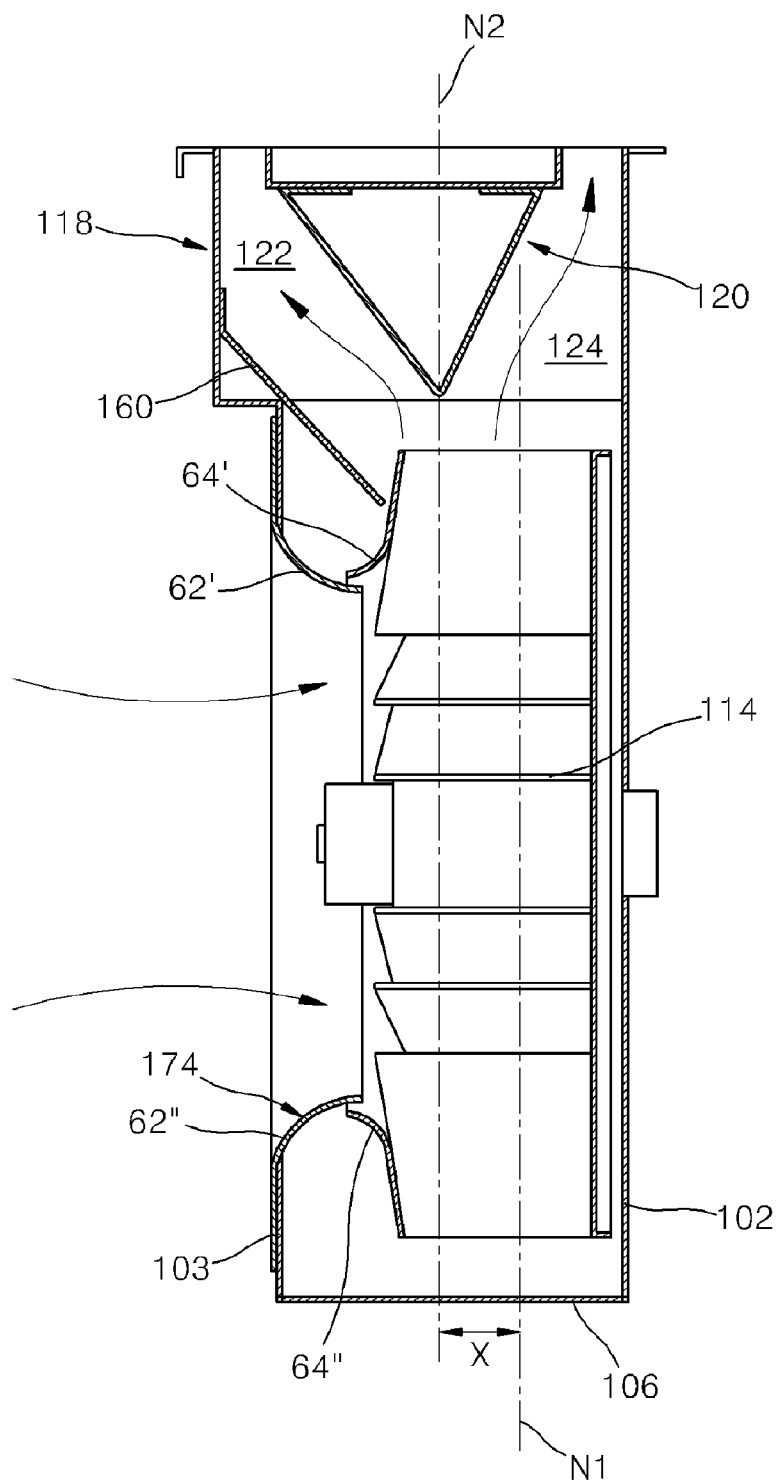
FIG. 4 is a cross-sectional view taken along a line I-I' of FIG. 2.

The guide vane 120, as illustrated in FIGS. 1, 2 and 4, may be disposed in the air chamber 118 above the air blowing unit 110 to define a front air cooler channel 122 and a rear air cooler channel 124. The guide vane 120 may divide air that flows upward from the air blowing unit 110 into two air flows, i.e., a front air flow and a rear air flow. The front air flow is directed into the front cooler air channel 122 and may be flowed across a front portion of the display unit 20. The rear air flow is directed into the rear cooler air channel 124 and may be flowed across a rear portion of the display unit 20. A longitudinal section of the guide vane 120 has a triangle shape, but the present general inventive concept is not limited thereto. Thus, various shapes capable of dividing the air that flows out from the air blowing unit 110 into two directions may be used.

Figure 5:
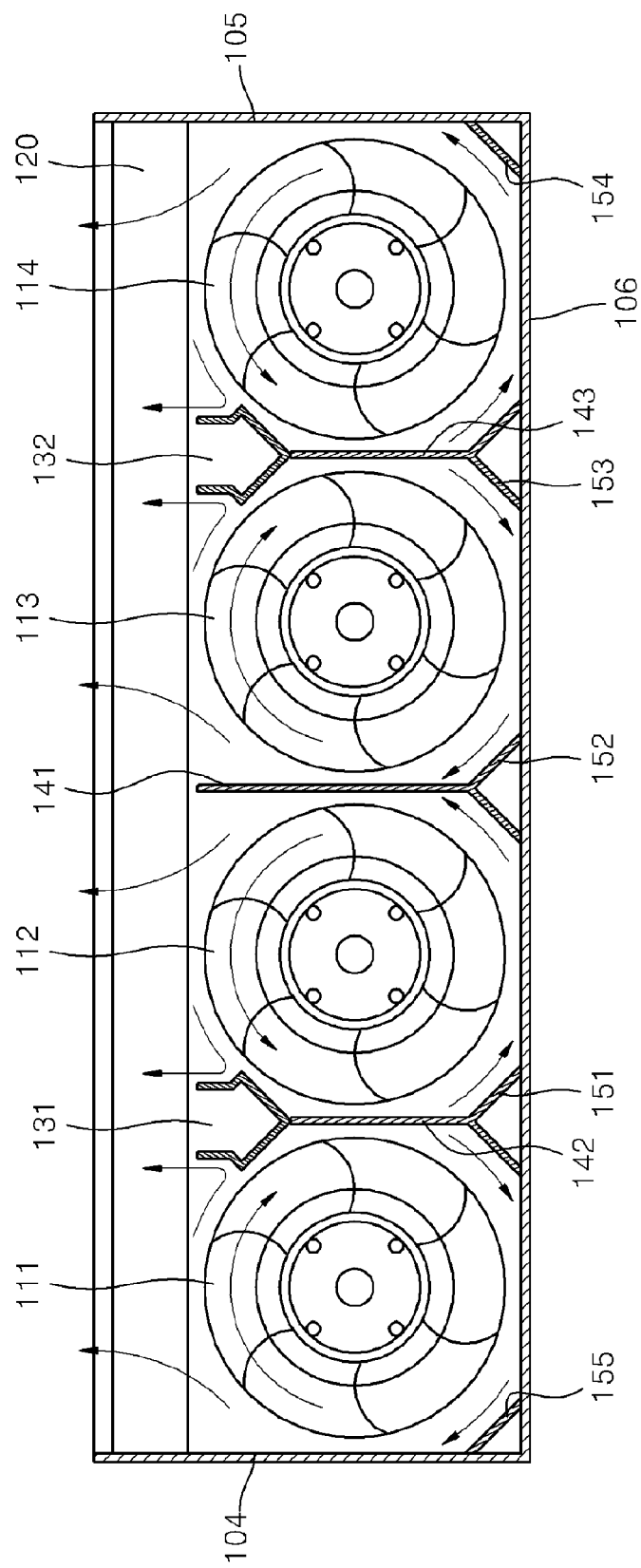
FIG. 5 is a cross-sectional view taken along a line II-II' of FIG. 2.

Referring to an exemplary embodiment illustrated in FIG. 5, two adjacent air blowers from among the air blowers 111, 112, 113, and 114 revolve in opposite directions to each other. That is, the air blowers 111 and 113 revolve clockwise, and the air blowers 112 and 114 revolve counterclockwise. Accordingly, an air blower may blow air upward, while in an area where a fan revolves downward (the right of the air blower in a clockwise revolution, and the left of the air blower in a counterclockwise revolution), air flows downward in a direction following the revolution of the fan.

At least one auxiliary guide vane 130 may be disposed between the air blowing unit 110 and the guide vane 120 such that at least one auxiliary guide vane 130 is disposed per each group of the air blowing unit 110. For example, a first auxiliary guide vane 131 may be disposed between the air blowers 111 and 112 forming one group of the air blowing unit 110, and a second auxiliary guide vane 132 may be disposed between the air blowers 113 and 114 forming the other group. Accordingly, the first auxiliary guide vane 131 guides downward flowing air generated by the air blowers 111, 112 in an upward direction toward the display unit 20 during the revolution of the air blowers 111 and 112. Similarly, a second auxiliary guide vane 132 may guide downward flowing air generated by air blowers 113, 114 in an upward direction toward the display unit 20 during the revolution of the air blowers 113 and 114. It can be appreciated that the auxiliary guide vane 130 is not limited to the shape illustrated in the drawings, and may include various forms and shapes to guide downward flowing air in and upward direction.

The interference preventing portion 141 may be disposed between groups of the air blowing unit 110. For example, the interference preventing portion 141 may be disposed between air blower 112 included in a first group and air blower 113 included in a second group. The interference preventing portion 141 prevents interference occurring due to collision between airflows respectively generated when the air blowers 112 and 113 revolve, and may guide the air upward.

The auxiliary interference preventing portions 142 and 143 may be respectively included with the two groups of the air blowing unit 110. For example, auxiliary interference preventing portion 142 may be disposed between the air blowers 111 and 112 included in a first group, and auxiliary interference preventing portion 143 may be disposed between the air blowers 113 and 114 included in a second group. The auxiliary interference preventing portions 142 and 143 may prevent interference occurring due to collision between air flows, each generated when the air blowers in each group of the air blowing unit 110 start revolving, and may guide air downward. In at least one exemplary embodiment, auxiliary interference preventing portions 142 and 143 may be respectively connected to the first auxiliary guide vane 131 and the second auxiliary guide vane 132.

The vortex removing portion 150 may be formed at both sides of a portion below each of the air blowers 111, 112, 113 and 114, so as to remove a vortex that may be generated in both corners of each of the air blowers 111, 112, 113 and 114. The vortex removing portion 150 may also include a plurality of first vortex removing parts. For example, at least one exemplary embodiment shown in FIG. 5 includes first vortex removing parts 151, 152, and 153 and second vortex removing parts 154 and 155.

In at least one exemplary embodiment illustrated in FIG. 5, a plurality of first vortex removing parts 151, 152 and 153 are respectively connected to the interference preventing portion 141 and the auxiliary interference preventing portions 142 and 143, so as to be inclined at a predetermined angle. Each of the first vortex removing parts 151, 152, and 153 may have a reversed V-shaped cross-section. The second vortex removing parts 154 and 155 are respectively formed to be connected to both the side plate 105 and the rear plate 106 and to both the side plate 104 and the rear plate 106. The second vortex removing parts 154 and 155 may be inclined at a predetermined angle.

Figure 3:
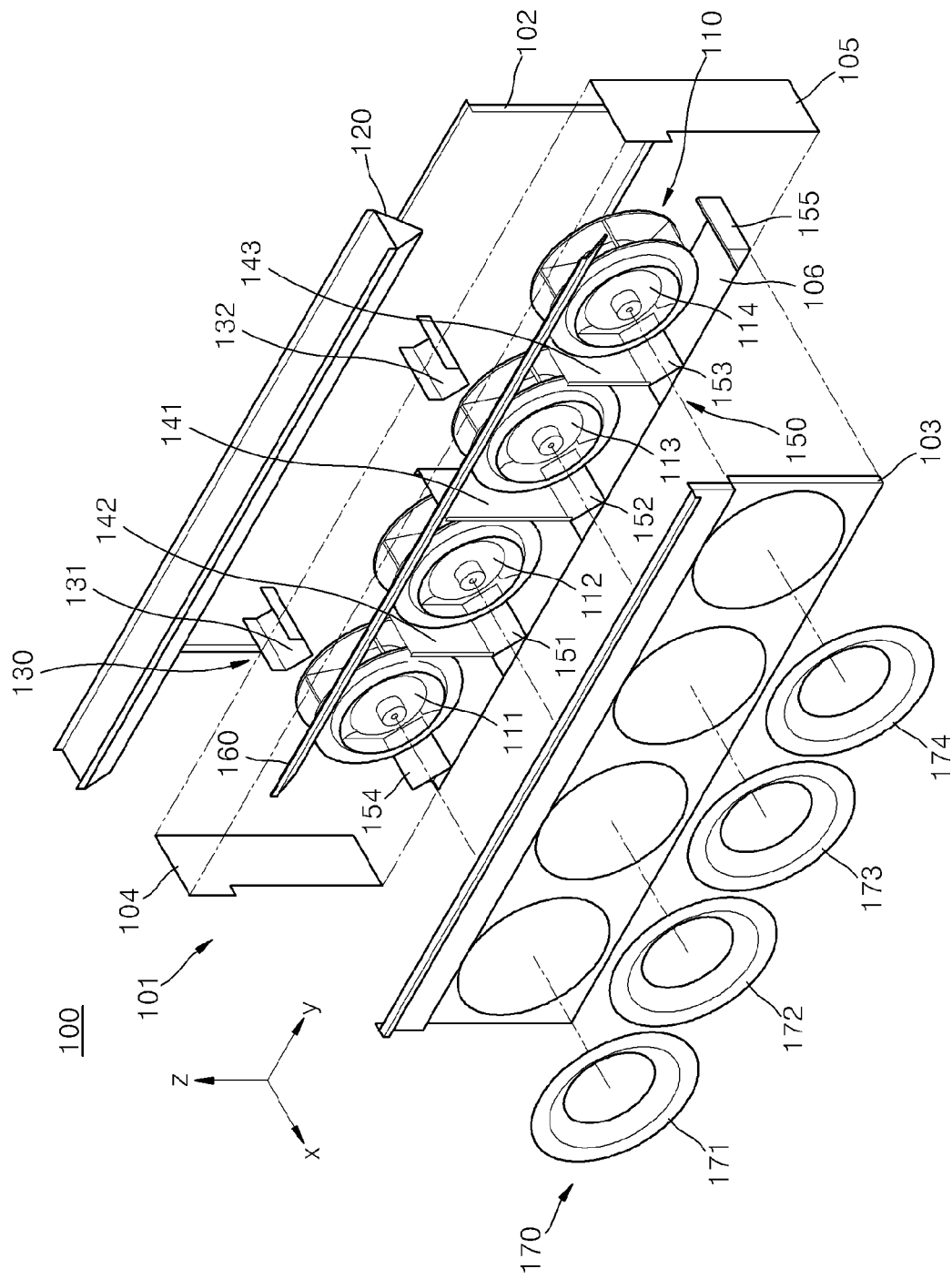
FIG. 3 is an exploded perspective view of the cooler of FIG. 2.

The side auxiliary guide vane 160, as illustrated in FIGS. 3 and 4, may be disposed to be parallel to the guide vane 120 in a lengthwise direction (y direction of FIG. 3) of the cooler 100 to guide air that flows out from the air blowing unit 110 toward the guide vane 120.

The suction inducing unit 170 may be disposed in the back plate 103 of the cooler housing 101, according to at least one exemplary embodiment. The suction inducing unit 170 may include a plurality of suction inducing units 171, 172, 173, and 174 respectively corresponding to the plurality of air blowers 111, 112, 113, and 114. The suction inducing unit 170 may be disposed to face the filter 60, as shown for example in FIG. 1, to allow external air that passes through the filter 60 to flow to each of the air blowers 111, 112, 113, and 114.

Additionally, each suction inducing unit 174 and each the air blower 114 may include a plate flange 62 and a blower flange 64, respectively, to assist in increasing the amount of air flow drawn into the cooler 100. Additionally the plate flange 62 may include a top plate flange 62' and a bottom plate flange 62". Similarly, the blower flange 64 may include a top blower flange 64' and a bottom blower flange 64".

As illustrated in an exemplary embodiment of FIG. 4, the plate flanges 62', 62" are coupled to an inside surface of the back plate 103 and extend radially toward the air blower 114. The blower flanges 64', 64" are coupled to a front surface of the air blower 114 and extend radially toward a respective plate flange 62', 62". Although at least one exemplary embodiment illustrated in FIG. 4 illustrates flanges having a curved shape, the flanges may include various other shapes to assist in increasing air flow into the cooler 100.

Accordingly, the flanges 62, 64 assist in preventing external air drawn into the cooler 100 from traversing around the air blower 114, thereby increasing the amount of air flow drawn into the cooler 100.

Referring now an exemplary embodiment illustrated in FIG. 4, a central normal N1 of the air blower 114 may be biased toward the front plate 102 of the cooler housing 101, so that the central normal N1 of the air blower 114 and a central normal N2 of the guide vane 120 are spaced apart from each other by a distance X. Accordingly, the air that flows out from the air blower 114 is divided in the guide vane 120, and a higher amount of air flows toward the front plate 102 than toward the back plate 103. Accordingly, since a front part of the display unit 20 is disposed adjacent to the front plate 102 of the cooler housing 101, heat generated from the front part of the display unit 20 may be effectively cooled.

An operation of a cooler according to an embodiment of the present general inventive concept will now be described with reference to the drawings.

Referring to FIGS. 1, 4 and 5, external air may be drawn in through the air inlet 50 and the filter 60, and flows into the display device housing 10 of the display device 1. The air passes through the suction inducing unit 170, flows into the air blowing unit 110 formed inside the cooler 100, and then is directed upward. The air directed from the air blowing unit 110 is divided into two directions by the guide vane 120. A front air flow flows to a front part of the display unit, and a rear air flow flows to a rear part of the display unit 20. The air may then be discharged to the outside through the air outlet 40. Although the outlet 40 is shown as being disposed at an upper side of the display device housing 10, the outlet 40 may be positioned at an alternate location of the housing 10. Accordingly, the external air may be circulated via the cooler 100 inside the display device housing 10 of the display device 1, by flowing in through the air inlet 50 and out through the air outlet 40, thereby cooling the display unit 20.

It can be appreciated that revolution directions of the air blowers 111, 112, 113, and 114 described above are not limited thereto. Further, although not shown in the drawing, the air blowers 111 and 113 may revolve counterclockwise, and the air blowers 112 and 114 may revolve clockwise. When the revolution directions of the air blowers 111, 112, 113, and 114 are changed, a direction in which air flows toward the air blower is changed, and thus the position of the auxiliary guide vane 130 may be changed, accordingly.

Figure 6:
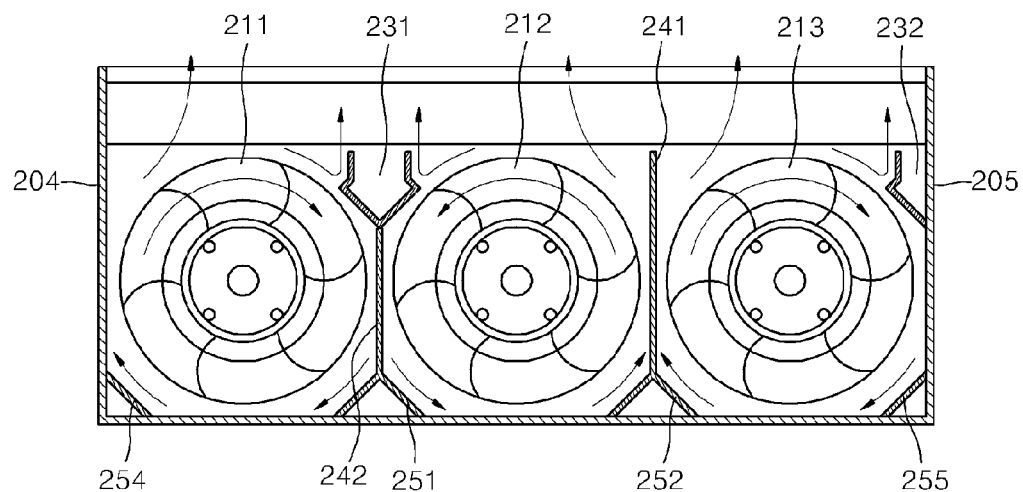
FIG. 6 is a cross-sectional view of a cooler, according to another exemplary embodiment of the present general inventive concept.

FIG. 6 is a cross-sectional view of a cooler, according to another embodiment of the present general inventive concept.

Figure 7:
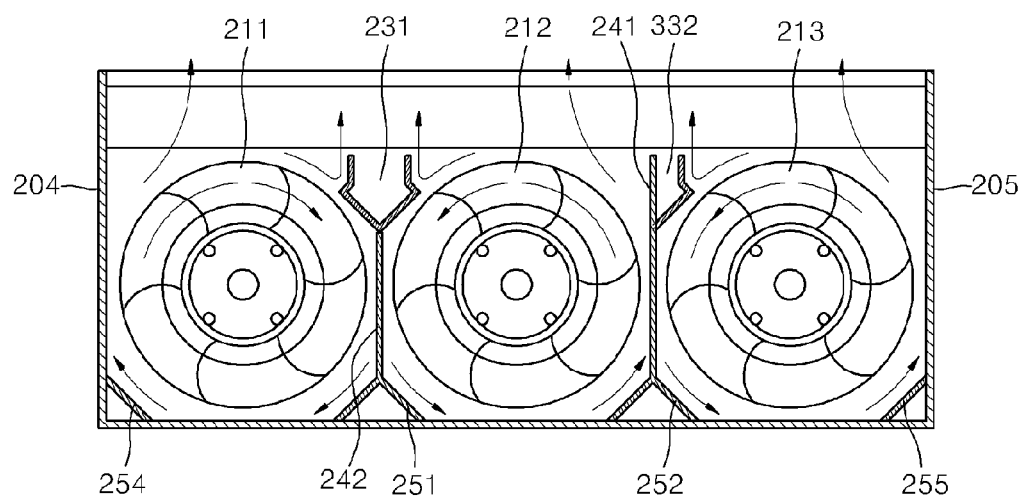
FIG. 7 is a cross-sectional view of a cooler, according to another exemplary embodiment of the present general inventive concept.

FIG. 7 is a cross-sectional view of a cooler, according to another embodiment of the present general inventive concept.

Referring to exemplary embodiments illustrated in FIGS. 6 and 7, an air blowing unit may include an odd number of air blowers.

A structure of FIG. 6 may be similar as that of the air blowers 111, 112 and 113 of the exemplary cooler illustrated in FIG. 5. Accordingly, to at least one exemplary embodiment illustrated in FIGS. 6 and 7, an air blowing unit includes a plurality of air blowers 211, 212 and 213. An interference preventing portion 241 and a first vortex removing part 252 are disposed between the air blowers 212 and 213. A first auxiliary guide vane 231, an auxiliary interference preventing portion 242 and the first vortex removing part 252 are disposed between the air blowers 211 and 212. Second vortex removing parts 254 and 255 are respectively disposed in side plates 204 and 205, respectively. A second auxiliary guide vane 232 is attached to the side plate 205, so that air flowing downward due to the air blower 213 revolving clockwise is induced upward.

An alternate exemplary embodiment illustrated in FIG. 7 includes an air blower 213 that revolves counterclockwise. Additionally, the second auxiliary guide vane 332 is attached to the interference preventing portion 241, so that air flowing downward due to the air blower 213 revolving counterclockwise may be directed upward.

Figure 8:
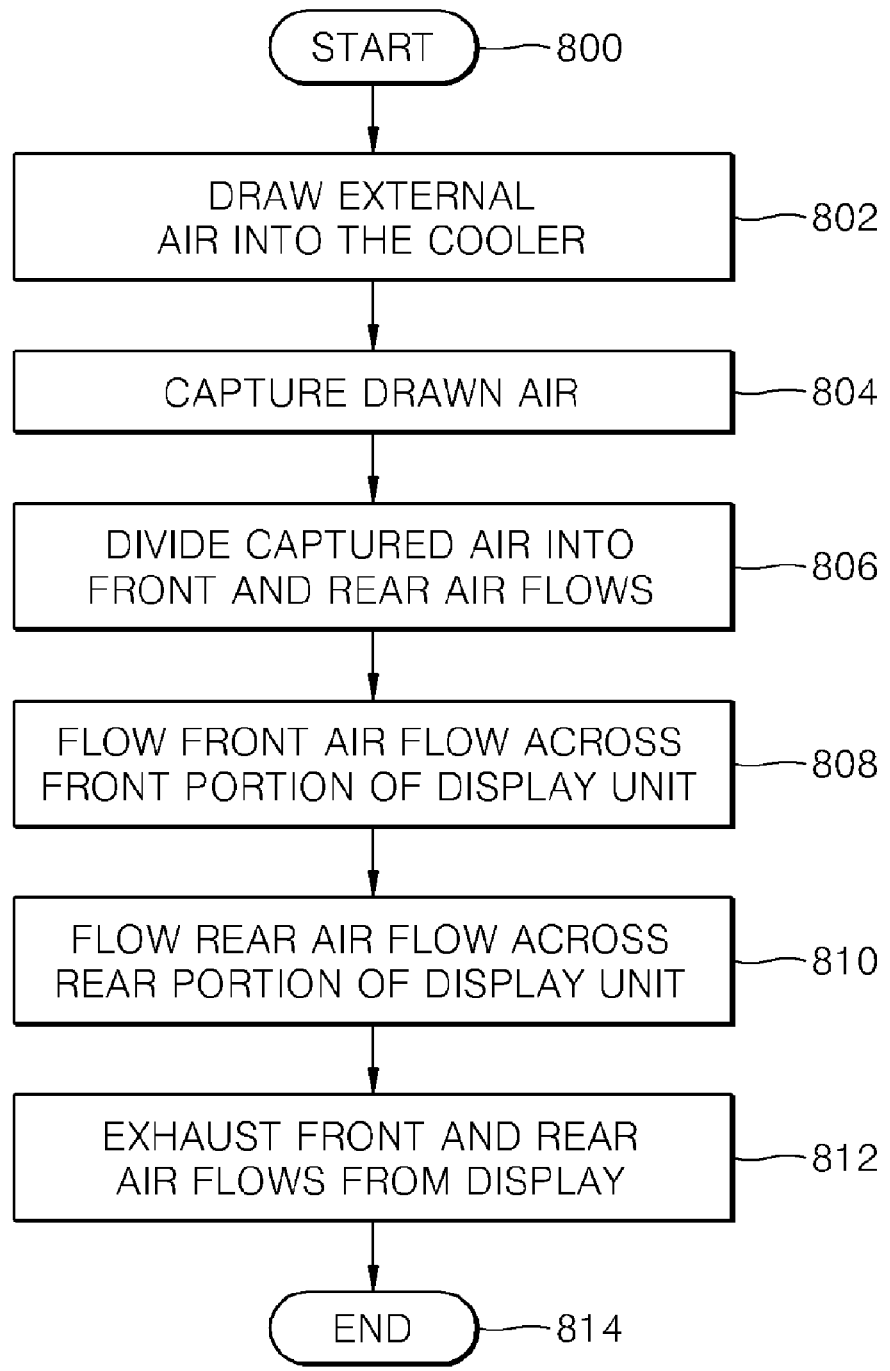
FIG. 8 is a method of cooling a display unit included in a display device using a cooling unit according to the present general inventive concept.

Referring now to FIG. 8, a flowchart illustrates a method of cooling a display unit included in a display device using a cooling unit according to the general inventive concept. The method begins at operation 800 and proceeds to operation 802 where external air is drawn into the cooler 100. In operation 804, the air drawn into the cooler 100 is captured. For example, an air chamber 118 included within the cooler 100 may capture the drawn air. The captured air is divided into a front air flow and a rear air flow in operation 806. As discussed above, a guide vain 120 according to an exemplary embodiment of the present general inventive concept may be disposed in the air chamber 118 and may divide air directed into the air chamber 118 into front and rear air flows. In operation 808, the front air flow is flowed across a front portion of the display unit 20, while the rear air flow is flowed across the display unit in operation 810. It can be appreciated that the front and rear air flows may be simultaneously flowed across front and rear portion of the display unit 20, respectively. In operation 812, the front and rear air flows may be exhausted from the display housing 10 via an air outlet 40, and the method ends at operation 814.

Hereinafter, Tables 1 through 3 show results of experiments conducted to support findings that a cooler according to the present general inventive concept provides improved cooling efficiency compared to a conventional cooler.

TABLE 1

|    | C1   | C2   | C3   | C4   | C5   |
|----|------|------|------|------|------|
| R1 | 49.9 | 46.4 | 49.1 | 49.8 | 48.0 |
| R2 | 50.0 | 54.9 | 56.5 | 56.9 | 57.8 |
| R3 | 44.4 | 48.8 | 45.5 | 45.4 | 44.4 |
| R4 | 49.4 | 47.3 | 51.2 | 47.5 | 48.9 |
| R5 | 33.9 | 36.1 | 35.4 | 35.8 | 34.1 |

TABLE 2

|    | C1   | C2   | C3   | C4   | C5   |
|----|------|------|------|------|------|
| R1 | 48.3 | 45.0 | 48.8 | 48.4 | 46.6 |
| R2 | 48.3 | 52.9 | 56.3 | 55.4 | 55.5 |
| R3 | 43.0 | 47.5 | 45.7 | 44.5 | 43.0 |
| R4 | 48.1 | 46.3 | 51.3 | 46.9 | 48.3 |
| R5 | 33.7 | 35.8 | 35.1 | 35.1 | 33.6 |

TABLE 3

|    | C1   | C2   | C3   | C4   | C5   |
|----|------|------|------|------|------|
| R1 | −1.6 | −1.4 | −0.3 | −1.4 | −1.4 |
| R2 | −1.7 | −2.0 | −0.2 | −1.5 | −2.3 |
| R3 | −1.4 | −1.3 |  0.2 | −0.9 | −1.4 |
| R4 | −1.3 | −1.0 |  0.1 | −0.6 | −0.6 |
| R5 | −0.2 | −0.3 | −0.3 | −0.7 | −0.5 |

In tables 1 through 3 above, C1 through C5 denote points marked on a horizontal direction of a display unit, R1 through R5 denote points marked on a vertical direction of the display unit, and C1 through C5 denote twenty five points marked in a grid pattern on the display unit.

Table 1 shows results obtained by measuring temperatures of each point when the display unit is cooled using a conventional cooler. Table 2 shows results obtained by measuring temperatures of each point when the display unit is cooled using the cooler according to an embodiment of the present general inventive concept. Table 3 shows temperature differences between Table 1 and Table 2.

Referring to Table 3, the temperature was decreased throughout the display unit up to 2.3 degrees.

Also, according to results measuring an amount of air flowed through both a conventional cooler and a cooler according to the present general inventive concept, the amount of air in the conventional cooler was $0.111[m^3/s]$, while the amount of air in the cooler according to an exemplary embodiments of the present general inventive concept was $0.125[m^3/s]$. Accordingly, the amount of air flowing through the cooler according to an embodiment of the present general inventive concept increased by about 12.6%.

Therefore, a cooler and a display device including the cooler according to the present general inventive concept have the following advantages:

First, the entire surface of a display unit can be uniformly cooled by controlling a direction of air flow rate, thereby preventing the display unit from deteriorating.

Second, a uniform temperature of the display unit can be achieved by forming a uniform and symmetrically shaped air flow across the display unit.

Third, the entire surface of the display unit, which is a heat generating unit, can be further effectively cooled by reducing loss of air flow rate, while increasing the amount of air flowing toward a front part of the display unit.

Although a few embodiments of the present general inventive concept have been shown and described, it would be appreciated by those skilled in the art that changes may be made in these exemplary embodiments without departing from the principles and spirit of the general inventive concept, the scope of which is defined in the claims and their equivalents.

What is claimed is:

1. A cooler comprising:
   a housing;
   an air blowing unit disposed inside the housing and sucking external air and blowing the external air in the housing, wherein the air blowing unit comprises a plurality of groups each including two air blowers;

a guide vane disposed above the air blowing unit and guiding air that flows out from the air blowing unit to flow in different directions; and a plurality of auxiliary guide vanes disposed between the air blowing unit and the guide vane, each of the auxiliary guide vane being disposed in each of the groups each including two air blowers, so as to guide air flowing below the air blowing unit to flow toward the guide vane.

2. The cooler of claim 1, wherein the air blowers forming each group of the air blowing unit revolve in opposite directions to each other.

3. The cooler of claim 2, wherein the auxiliary guide vane is disposed between the air blowers forming each group.

4. The cooler of claim 1, further comprising an interference preventing portion that is disposed between the plurality of groups of the air blowing unit, prevents interference of air flows between the groups of the air blowing unit, and guides air to flow toward the guide vane.

5. The cooler of claim 4, further comprising an auxiliary interference preventing portion disposed between the air blowers forming each group of the air blowing unit so as to prevent interference of air flows between the air blowers and to guide the air to flow toward the guide vane.

6. The cooler of claim 5, further comprising a plurality of vortex removing portions disposed at both sides of a portion below each of the air blowers so as to remove a vortex generated when the air blower revolves.

7. The cooler of claim 6, wherein the vortex removing portion comprises a plurality of first vortex removing portions that are respectively connected to the interference preventing portion and the auxiliary interference preventing portion and each have a reversed V-shaped cross-section, and a plurality of second vortex removing portions that are respectively formed to be connected to side plates of the housing so as to be inclined at a predetermined angle.

8. The cooler of claim 1, further comprising a side auxiliary guide vane that is disposed to be parallel to the guide vane and guides air that flows out from the air blowers to flow toward the guide vane.

9. The cooler of claim 1, wherein a normal central axis perpendicular with respect to a revolution axis of the air blower is spaced apart from a normal guide vane axis that corresponds to the guide vane and that is perpendicular with respect to the revolution axis.

10. The cooler of claim 1, further comprising a plurality of suction inducing units each guiding external air of the housing to flow toward the air blower.

11. A display device comprising:
a display unit to display an image; and
a cooler to cool heat generated from the display unit, wherein the cooler comprises:
a housing;
an air blowing unit disposed inside the housing and sucking external air and blowing the external air in the housing, wherein the air blowing unit comprises a plurality of groups each including two air blowers;
a guide vane disposed above the air blowing unit and guiding air that flows out from the air blowing unit to flow in different directions; and
a plurality of auxiliary guide vanes disposed between the air blowing unit and the guide vane, each of the auxiliary guide vanes being disposed in each of the groups each including two air blowers, so as to guide air flowing below the air blowing unit to flow toward the guide vane.

12. The display device of claim 11, wherein the air blowers forming each group of the air blowing unit revolve in opposite directions to each other.

13. The display device of claim 12, wherein the auxiliary guide vane is disposed between the air blowers forming each group.

14. The display device of claim of 11, further comprising an interference preventing portion that is disposed between the plurality of groups of the air blowing unit, prevents interference of air flows between the groups of the air blowing unit, and guides air to flow toward the guide vane.

15. The display device of claim of 14, further comprising an auxiliary interference preventing portion disposed between the air blowers forming each group of the air blowing unit so as to prevent interference of air flows between the air blowers and to guide the air to flow toward the guide vane.

16. The display device of claim of 15, further comprising a plurality of vortex removing portions disposed at both sides of a portion below each of the air blowers so as to remove a vortex generated when the air blower revolves.

17. The display device of claim of 16, wherein the vortex removing portion comprises a plurality of first vortex removing portions that are respectively connected to the interference preventing portion and the auxiliary interference preventing portion and each have a reversed V-shaped cross-section, and a plurality of second vortex removing portions that are respectively formed to be connected to side plates of the housing so as to be inclined at a predetermined angle.

18. The display device of claim of 11, further comprising a side auxiliary guide vane that is disposed to be parallel to the guide vane and guides air that flows out from the air blowers to flow toward the guide vane.

19. The display device of claim of 11, wherein a normal central axis perpendicular with respect to a revolution axis of the air blower is spaced apart from a normal guide vane axis that corresponds to the guide vane and that is perpendicular with respect to the revolution axis.

20. The display device of claim of 19, wherein a central normal with respect to a revolution axis of the air blower is biased toward the display unit.

21. The display device of claim of 11, further comprising a plurality of suction inducing units each guiding external air of the housing to flow toward the air blower.

22. A cooler comprising:
a housing extending lengthwise along an axis and having an air chamber traversing along the axis and extending to a top opening;
an air blowing unit disposed in the housing and below the air chamber and including a plurality of air blowers disposed along the axis of the housing to draw external air inside the housing and to flow air upward toward the air chamber; and
a guide vane disposed in the air chamber and defining a front cooler air channel extending to the top opening of the housing and a rear cooler air channel extending to the top opening of the housing.

23. The cooler of claim 22, wherein the guide vain comprises:
a first side to direct air into the front cooler air channel to generate a front air flow; and
a second side to direct air into the rear cooler air channel to generate a rear air flow.

24. A display device comprising:
a display housing including a top and a bottom having an air passage and a front portion extending from the bottom to the top and a rear portion extending from the bottom to the top and having a front housing air path inside the front portion extending from the air passage to the top of the housing and a rear housing air path inside the rear portion extending from the air passage to the top of the housing;

a display unit disposed in the housing and between the front housing air path and the rear housing air path;

a cooler comprising:

a cooler housing including an open top disposed against the air passage of the bottom of the display housing and including an air chamber inside the cooler housing extending to the open top to direct air toward the air passage of the display housing;

an air blowing unit disposed in the cooler housing and below the air chamber and including at least one blower to draw external air inside the cooler housing and to flow the drawn air upward toward the air chamber; and a guide vane disposed in the chamber and defining a front cooler air channel in communication with the front housing air path and defining a rear cooler air channel in communication with the rear housing air path, wherein air drawn into the cooler housing by the blower flows from the front and rear cooler air channels into the front and rear housing paths, respectively, via the guide vane and the display unit is cooled as air flows through the front housing air path and the rear housing air path.

25. The display device of claim 24, wherein the cooler housing further includes an air inlet direct external air to the blower.

26. The display device of claim 24, further comprising:

a top air passage formed by the top of the housing to communicate the front housing air path with the rear housing air path; and an air outlet disposed on the display housing to exhaust air from inside the display housing.

27. A method of cooling a display unit included in a display device using a cooling unit, comprising:

drawing external air into the cooling unit;

capturing the drawn air into an air chamber of the cooling unit;

dividing the captured air in the air chamber into a front air flow and a rear air flow;

flowing the front air flow across a front side of the display unit; and flowing the rear air flow across a rear side of the display unit.

28. The method of claim 27 further comprising flowing the front air flow against the rear side of the display unit to further cool the display unit.

29. The method of claim 28 further comprising flowing the front air flow against the rear air side of the display unit after being flowed across the front side of the display unit.

30. The method of claim 27 further comprising exhausting the front and rear air flows from the display device.

\* \* \* \* \*